United States Patent
Cochran

(10) Patent No.: US 9,069,635 B2
(45) Date of Patent: Jun. 30, 2015

(54) PROCESS FOR COMPRESSING APPLICATION DEPLOYMENTS

(75) Inventor: Benjamin D. Cochran, Corta Madera, CA (US)

(73) Assignee: Autodesk, Inc., San Rafael, CA (US)

( * ) Notice: Subject to any disclaimer, the term of this patent is extended or adjusted under 35 U.S.C. 154(b) by 305 days.

(21) Appl. No.: 13/442,364

(22) Filed: Apr. 9, 2012

(65) Prior Publication Data
US 2013/0268927 A1    Oct. 10, 2013

(51) Int. Cl.
*G06F 9/445*    (2006.01)
*H03M 7/30*    (2006.01)

(52) U.S. Cl.
CPC ............... *G06F 8/60* (2013.01); *H03M 7/3084* (2013.01)

(58) Field of Classification Search
None
See application file for complete search history.

(56) References Cited

U.S. PATENT DOCUMENTS

| 7,783,777 | B1 | 8/2010 | Pabla et al. |
| 7,865,575 | B2 | 1/2011 | Leitheiser |
| 2002/0049760 | A1 | 4/2002 | Scott et al. |
| 2003/0105716 | A1 | 6/2003 | Sutton et al. |
| 2003/0233455 | A1 | 12/2003 | Leber et al. |
| 2006/0106885 | A1* | 5/2006 | Blumenau et al. ............ 707/200 |
| 2010/0094817 | A1 | 4/2010 | Ben-Shaul et al. |
| 2011/0004564 | A1* | 1/2011 | Rolia et al. .................... 705/348 |

OTHER PUBLICATIONS

Microsoft Support, "How a slow link is detected for processing user profiles and Group Policy", Feb. 23, 2007.

* cited by examiner

*Primary Examiner* — Chuck Kendall
(74) *Attorney, Agent, or Firm* — Gates & Cooper LLP

(57) ABSTRACT

A method, apparatus, article of manufacture, and computer readable storage medium provide the ability to compress an application deployment. A master application to be deployed that has two or more files is obtained. The files in the master application are inventoried and two file instances that are identical are identified. An application deployment, based on the master application, is written by writing the first file instance and replacing additional identical file instances with links to the first file instance.

24 Claims, 3 Drawing Sheets

PROCESS FOR COMPRESSING APPLICATION DEPLOYMENTS

BACKGROUND OF THE INVENTION

1. Field of the Invention

The present invention relates generally to deploying applications, and in particular, to a method, apparatus, and article of manufacture for reducing/compressing the space needed for an application deployment.

2. Description of the Related Art

Applications and/or suites of applications are commonly delivered/deployed to clients on disc (e.g., compact discs [CDs] or digital video discs [DVDs]), universal serial bus (USB) flash drives, or transmitted across a network (e.g., the Internet). As these applications and application suites become more complex, the size of the deployment can be problematic (e.g., consuming multiple CDs/DVDs/USB flash drives or taking excessive amounts of time to download/transfer across a network). Prior art solutions have attempted to compress the application data in accordance with traditional lossless compression techniques (e.g., Lempel-Ziv [LZ] compression, DEFLATE™, run-length encoding [RLE], etc.). However, such compression techniques have failed to minimize and/or substantially reduce the deployment size. Accordingly, what is needed is a system and method that reduces the deployment size of an application/application suite efficiently and quickly. To better understand the problems of the prior art, a description of prior art deployment systems may be useful.

Many applications are not only large but are sold as part of a suite or package of applications. In the past, applications and suites were sold on floppy discs. As the size of the applications grew, the number of required floppy discs grew as well. Similar problems result when deploying applications on CDs or DVDs. While CDs and DVDs are commonly used, vendors may also utilize a USB drive for distribution. However, USBs have a higher cost compared to DVDs. Further, the price of a USB increases exponentially with the size. In addition, with the increased use of the Internet, rather than deploying an application/application suite on a physical media (e.g., CD/DVD/USB), applications and suites may be deployed via electronic delivery (e.g., across the Internet). In such deployments, the download time can be prohibitively long. Accordingly, a substantial value and benefit exists if more data can be stored on a drive/media of a fixed size and/or if the size of the application/application suite can be substantially reduced.

To increase the storage capacity of a fixed size drive, prior art solutions have attempted compression. Such compression attempts to compress large suites onto a smaller drive providing the user with the same experience yet lowering the cost of the goods/media. To maximize compression, the application may need to be developed (from the very beginning of the product's evolution) while taking size considerations into account. In this regard, to reduce the deployment size, applications can be engineered with size reduction as a goal. However, with very large (multiple GB and thousands of files) applications created over many years, size reduction can be an impossible effort. To enable such size reduction, development teams need to manually map out all of the potentially redundant files across the application and create installers that copy the files into the correct locations such that if two separate sub-components (part of an application) share a common module they will only be in the deployment package once. Such a process is time consuming and creates problems when one of the sub-components wants to update the common module. Accordingly, the use of a shared module creates undesirable dependences on the two application sub-components. When manually optimizing for size, these undesirable dependences are created. When applications have thousands of sub-components and when suites of applications are collected together, the testing interdependency makes the manually optimization process impossible. Accordingly, with legacy products (i.e., earlier versions of a product, products that are no longer supported by a vendor, and/or products that are configured to operate on obsolete or old hardware), such development from early in a product's evolution is not possible. Nonetheless, it is still desirable to reduce the size of such legacy products/suites without having to redesign the product itself. Embodiments of the present invention achieves an optimized version of manual size reduction through an automated process with no additional work from the development team and without adding any unwanted dependencies between sub-components.

In addition to the above, installation tools may be used across multiple products/product suites including legacy products. It is desirable to retain the structure of the installation tools (i.e., without modifying the installation tools) while still reducing the distribution size.

In many application deployments, although not recognized in much of the prior art, multiple instances of identical files may be used (e.g., the same files are on the application deployment several times). While the repeated use of the identical files may appear with single applications, such a repeated use is exacerbated with product suites. It is desirable to remove all of the identical files to decrease the consumption of space. However, with suites, it is difficult to remove all of the identical files because each of the applications in the suite may be deployed individually itself and in suites. In addition, due to dependencies on each instance of a file, the removal of an identical file can increase the components' dependencies.

Accordingly, having a file multiple times on an application deployment is a convenience for a product development team. Removing the identical files across a suite of products (e.g., across all Autodesk™ products, the assignee of the present application) could potentially take years of work and editing of the products themselves. Further, removing one-hundred percent (100%) of the redundant files by hand is not practical.

In view of the above, it is desirable to provide the capability to remove all instances of identical files from an application deployment (thereby reducing the size of the deployment) while enabling the installation of multiple copies of the files at a destination computer without modifying the installer.

SUMMARY OF THE INVENTION

Embodiments of the invention overcome the problems of the prior art by automatically searching for copies of redundant files and replacing such files with links. After duplicate/redundant files are reduced to zero (0) bytes, other compression tools may be used to further reduce the size. Such a replacement allows applications to ship on smaller media. Alternatively, more content can be added to the deployment without altering the media size.

BRIEF DESCRIPTION OF THE DRAWINGS

Referring now to the drawings in which like reference numbers represent corresponding parts throughout.

DETAILED DESCRIPTION OF THE PREFERRED EMBODIMENTS

Figure 1:
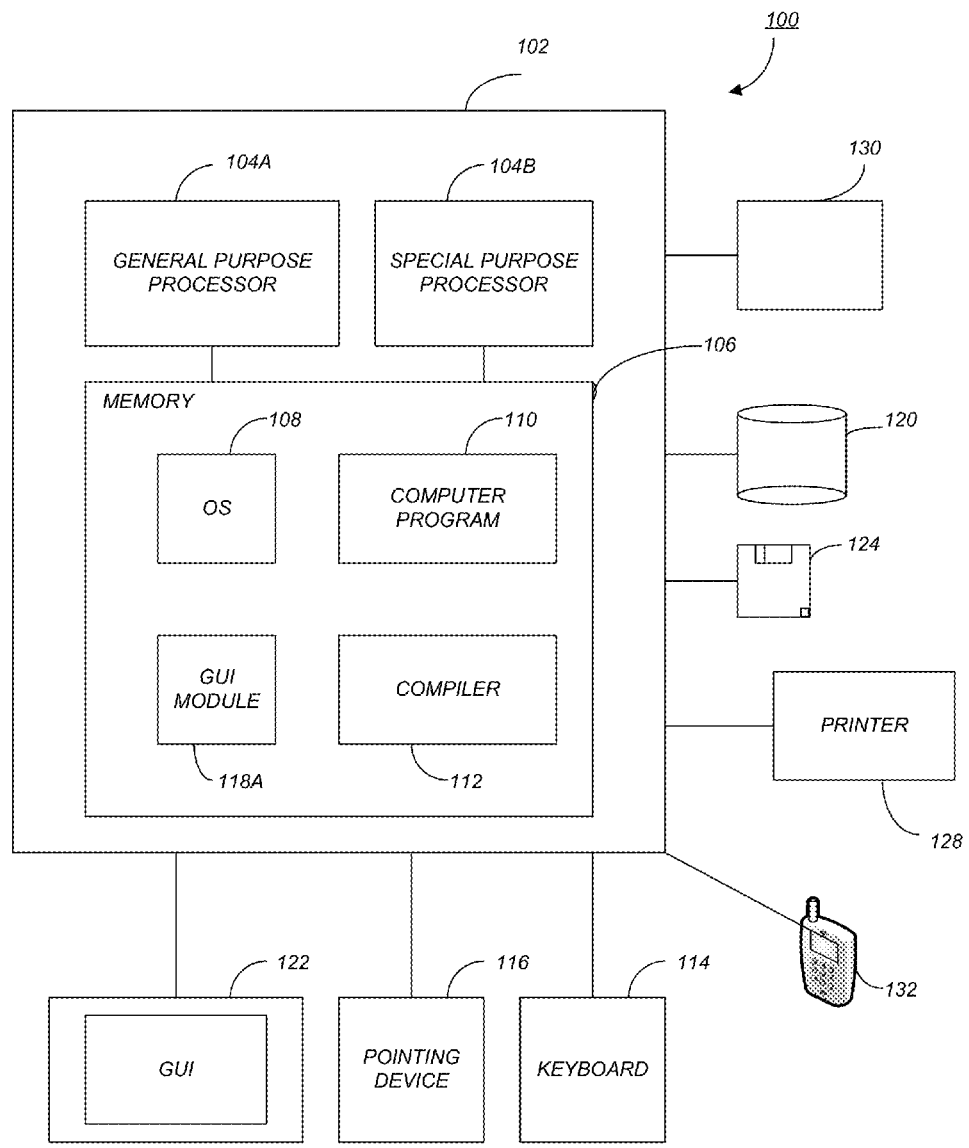
FIG. 1 is an exemplary hardware and software environment used to implement one or more embodiments of the invention.

In the following description, reference is made to the accompanying drawings which form a part hereof, and which is shown, by way of illustration, several embodiments of the present invention. It is understood that other embodiments may be utilized and structural changes may be made without departing from the scope of the present invention.
Hardware Environment FIG. 1 is an exemplary hardware and software environment 100 used to implement one or more embodiments of the invention. The hardware and software environment includes a computer 102 and may include peripherals. Computer 102 may be a user/client computer, server computer, or may be a database computer. The computer 102 comprises a general purpose hardware processor 104A and/or a special purpose hardware processor 104B (hereinafter alternatively collectively referred to as processor 104) and a memory 106, such as random access memory (RAM). The computer 102 may be coupled to, and/or integrated with, other devices, including input/output (I/O) devices such as a keyboard 114, a cursor control device 116 (e.g., a mouse, a pointing device, pen and tablet, touch screen, multi-touch device, etc.) and a printer 128. In one or more embodiments, computer 102 may be coupled to, or may comprise, a portable or media viewing/listening device 132 (e.g., an MP3 player, iPod™, Nook™, portable digital video player, cellular device, personal digital assistant, etc.). In yet another embodiment, the computer 102 may comprise a multi-touch device, mobile phone, gaming system, internet enabled television, television set top box, or other internet enabled device executing on various platforms and operating systems.

In one embodiment, the computer 102 operates by the general purpose processor 104A performing instructions defined by the computer program 110 under control of an operating system 108. The computer program 110 and/or the operating system 108 may be stored in the memory 106 and may interface with the user and/or other devices to accept input and commands and, based on such input and commands and the instructions defined by the computer program 110 and operating system 108, to provide output and results.

Output/results may be presented on the display 122 or provided to another device for presentation or further processing or action. In one embodiment, the display 122 comprises a liquid crystal display (LCD) having a plurality of separately addressable liquid crystals. Alternatively, the display 122 may comprise a light emitting diode (LED) display having clusters of red, green and blue diodes driven together to form full-color pixels. Each liquid crystal or pixel of the display 122 changes to an opaque or translucent state to form a part of the image on the display in response to the data or information generated by the processor 104 from the application of the instructions of the computer program 110 and/or operating system 108 to the input and commands. The image may be provided through a graphical user interface (GUI) module 118A. Although the GUI module 118A is depicted as a separate module, the instructions performing the GUI functions can be resident or distributed in the operating system 108, the computer program 110, or implemented with special purpose memory and processors.

In one or more embodiments, the display 122 is integrated with/into the computer 102 and comprises a multi-touch device having a touch sensing surface (e.g., track pod or touch screen) with the ability to recognize the presence of two or more points of contact with the surface. Examples of multi-touch devices include mobile devices (e.g., iPhone™, Nexus S™, Droid™ devices, etc.), tablet computers (e.g., iPad™, HP Touchpad™), portable/handheld game/music/video player/console devices (e.g., iPod Touch™, MP3 players, Nintendo 3DS™, PlayStation Portable™, etc.), touch tables, and walls (e.g., where an image is projected through acrylic and/or glass, and the image is then backlit with LEDs).

Some or all of the operations performed by the computer 102 according to the computer program 110 instructions may be implemented in a special purpose processor 104B. In this embodiment, the some or all of the computer program 110 instructions may be implemented via firmware instructions stored in a read only memory (ROM), a programmable read only memory (PROM) or flash memory within the special purpose processor 104B or in memory 106. The special purpose processor 104B may also be hardwired through circuit design to perform some or all of the operations to implement the present invention. Further, the special purpose processor 104B may be a hybrid processor, which includes dedicated circuitry for performing a subset of functions, and other circuits for performing more general functions such as responding to computer program instructions. In one embodiment, the special purpose processor is an application specific integrated circuit (ASIC).

The computer 102 may also implement a compiler 112 that allows an application program 110 written in a programming language such as COBOL, Pascal, C++, FORTRAN, or other language to be translated into processor 104 readable code. Alternatively, the compiler 112 may be an interpreter that executes instructions/source code directly, translates source code into an intermediate representation that is executed, or that executes stored precompiled code. Such source code may be written in a variety of programming languages such as Java™, Perl™, Basic™, etc. After completion, the application or computer program 110 accesses and manipulates data accepted from I/O devices and stored in the memory 106 of the computer 102 using the relationships and logic that were generated using the compiler 112.

The computer 102 also optionally comprises an external communication device such as a modem, satellite link, Ethernet card, or other device for accepting input from, and providing output to, other computers 102.

In one embodiment, instructions implementing the operating system 108, the computer program 110, and the compiler 112 are tangibly embodied in a non-transient computer-readable medium, e.g., data storage device 120, which could include one or more fixed or removable data storage devices, such as a zip drive, floppy disc drive 124, hard drive, CD-ROM drive, tape drive, etc. Further, the operating system 108 and the computer program 110 are comprised of computer program instructions which, when accessed, read and executed by the computer 102, cause the computer 102 to perform the steps necessary to implement and/or use the present invention or to load the program of instructions into a memory, thus creating a special purpose data structure causing the computer to operate as a specially programmed computer executing the method steps described herein. Computer program 110 and/or operating instructions may also be tangibly embodied in memory 106 and/or data communications devices 130, thereby making a computer program product or article of manufacture according to the invention. As such, the terms "article of manufacture," "program storage device," and "computer program product," as used herein, are intended to encompass a computer program accessible from any computer readable device or media.

Of course, those skilled in the art will recognize that any combination of the above components, or any number of different components, peripherals, and other devices, may be used with the computer 102.

Figure 2:
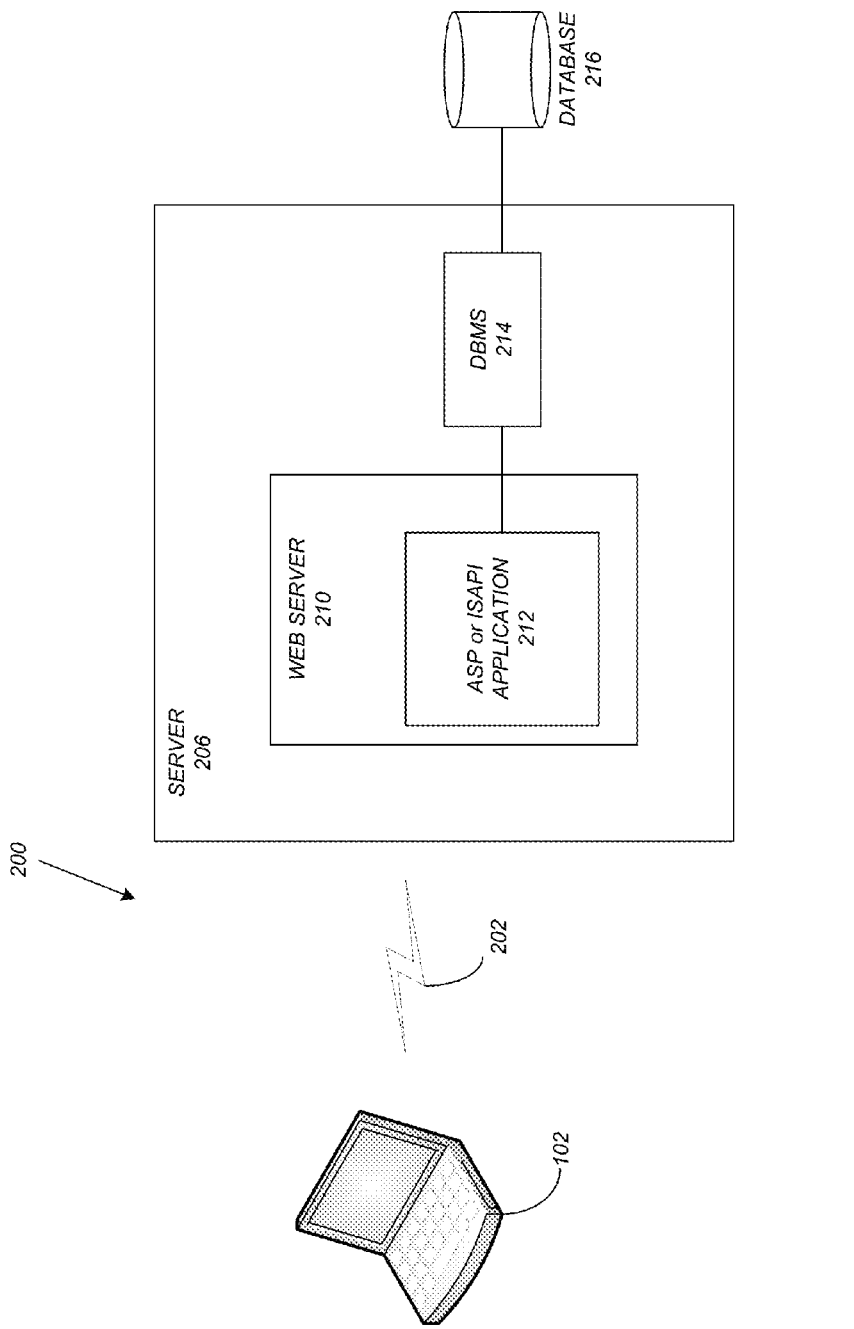
FIG. 2 schematically illustrates a typical distributed computer system using a network to connect client computers to server computers in accordance with one or more embodiments of the invention.

FIG. 2 schematically illustrates a typical distributed computer system 200 using a network 202 to connect client computers 102 to server computers 206. A typical combination of resources may include a network 202 comprising the Internet, LANs (local area networks), WANs (wide area networks), SNA (systems network architecture) networks, or the like, clients 102 that are personal computers or workstations, and servers 206 that are personal computers, workstations, minicomputers, or mainframes (as set forth in FIG. 1). However, it may be noted that different networks such as a cellular network (e.g., GSM [global system for mobile communications] or otherwise), a satellite based network, or any other type of network may be used to connect clients 102 and servers 206 in accordance with embodiments of the invention.

A network 202 such as the Internet connects clients 102 to server computers 206. Network 202 may utilize ethernet, coaxial cable, wireless communications, radio frequency (RF), etc. to connect and provide the communication between clients 102 and servers 206. Clients 102 may execute a client application or web browser and communicate with server computers 206 executing web servers 210. Such a web browser is typically a program such as MICROSOFT INTERNET EXPLORER™, MOZILLA FIREFOX™, OPERA™, APPLE SAFARI™, etc. Further, the software executing on clients 102 may be downloaded from server computer 206 to client computers 102 and installed as a plug-in or ACTIVEX™ control of a web browser. Accordingly, clients 102 may utilize ACTIVEX™ components/component object model (COM) or distributed COM (DCOM) components to provide a user interface on a display of client 102. The web server 210 is typically a program such as MICROSOFT'S INTERNET INFORMATION SERVER™.

Web server 210 may host an Active Server Page (ASP) or Internet Server Application Programming Interface (ISAPI) application 212, which may be executing scripts. The scripts invoke objects that execute business logic (referred to as business objects). The business objects then manipulate data in database 216 through a database management system (DBMS) 214. Alternatively, database 216 may be part of, or connected directly to, client 102 instead of communicating/obtaining the information from database 216 across network 202. When a developer encapsulates the business functionality into objects, the system may be referred to as a component object model (COM) system. Accordingly, the scripts executing on web server 210 (and/or application 212) invoke COM objects that implement the business logic. Further, server 206 may utilize MICROSOFT'S™ Transaction Server (MTS) to access required data stored in database 216 via an interface such as ADO (Active Data Objects), OLE DB (Object Linking and Embedding DataBase), or ODBC (Open DataBase Connectivity).

Generally, these components 200-216 all comprise logic and/or data that is embodied in/or retrievable from device, medium, signal, or carrier, e.g., a data storage device, a data communications device, a remote computer or device coupled to the computer via a network or via another data communications device, etc. Moreover, this logic and/or data, when read, executed, and/or interpreted, results in the steps necessary to implement and/or use the present invention being performed.

Although the terms "user computer", "client computer", and/or "server computer" are referred to herein, it is understood that such computers 102 and 206 may be interchangeable and may further include thin client devices with limited or full processing capabilities, portable devices such as cell phones, notebook computers, pocket computers, multi-touch devices, and/or any other devices with suitable processing, communication, and input/output capability.

Of course, those skilled in the art will recognize that any combination of the above components, or any number of different components, peripherals, and other devices, may be used with computers 102 and 206.

Software Embodiments

Embodiments of the invention are implemented as a software application on a client 102 or server computer 206. Further, as described above, the client 102 or server computer 206 may comprise a thin client device or a portable device that has a multi-touch-based display.

Having a file multiple times on an application deployment is a convenience for a product team. Removing these identical files across a suite of products or all products from a particular application provider could potentially take years of work. Accordingly, removing one-hundred percent (100%) of the redundant files by hand is not practical. At the same time, a computer (e.g., client 102 or server computer 206) can easily find all of these files and replace them with hard-links. Hard-links (or symbolic links or soft links or junctions [i.e., directory symbolic links such as NTFS—(new technology file system—the standard file system of Windows NT™) junctions in the Windows™ operating system]) can be used to completely remove redundant files without modifying the installer. Embodiments of the invention perform such an automatic and complete removal of the redundant files without modifying the installer.

Figure 3:
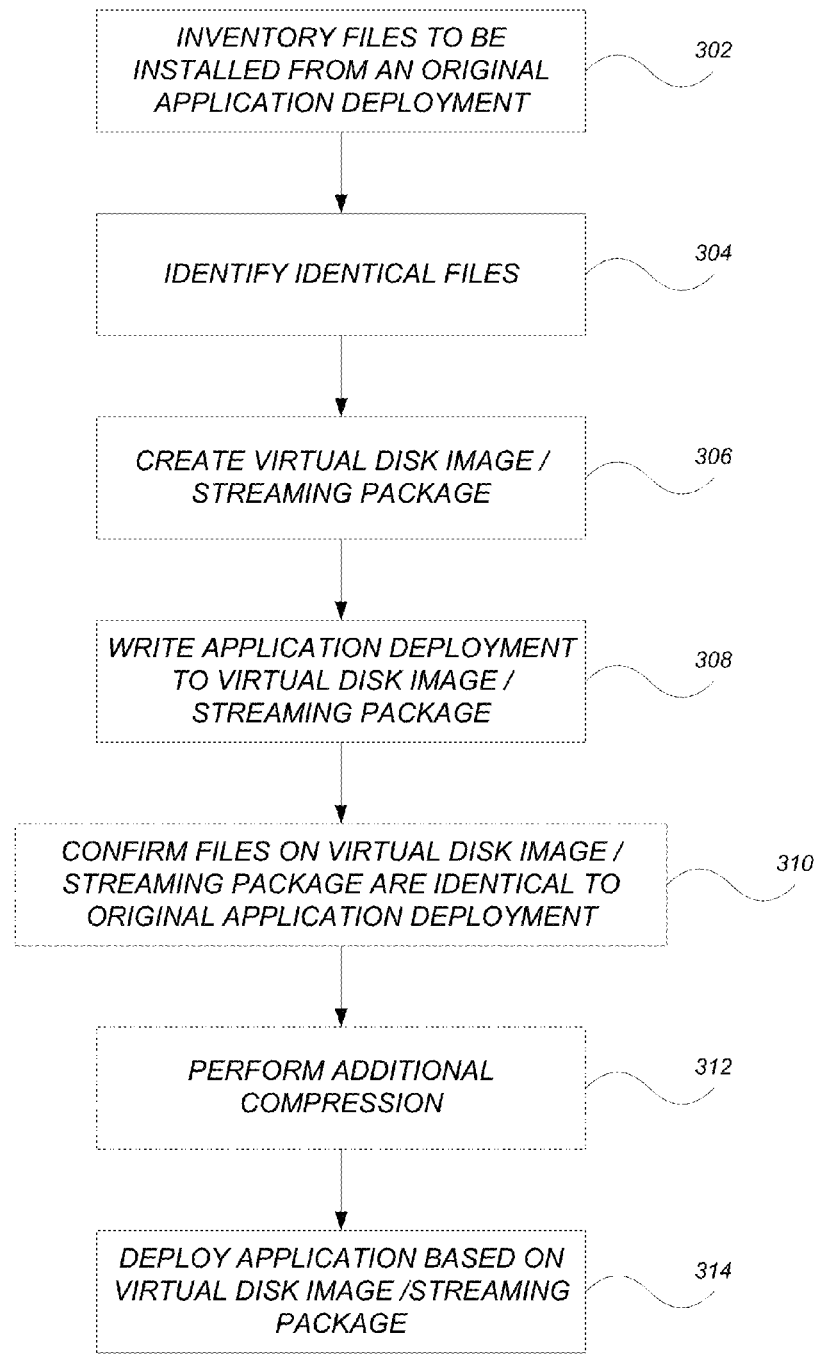
FIG. 3 is a flow chart illustrating the use of a tool to compress an application deployment in accordance with one or more embodiments of the invention.

FIG. 3 is a flow chart illustrating the use of a tool to compress an application deployment in accordance with one or more embodiments of the invention.

At step 302, the files to be installed from a master (also referred to herein as original application deployment) are inventoried/identified. Such an inventory may be conducted using an inventory tool. The inventory tool/process may make a list of every file needed for an application deployment based on the master. Further, the inventory process calculates/determines a checksum value for each file. As used herein, a checksum (also referred to as a hash sum) is a computed numerical value that depends on (and is calculated for) a particular file that uniquely identifies (or represents a fingerprint of) the file, against which later comparisons can be conducted to ensure that the file has not been corrupted (e.g., during transmission and/or storage) (i.e., is identical to the original version of the file). Thus, the output of the inventory tool consists of checksum values for the files received as input (e.g., an application deployment).

At step 304, the checksums are used to identify identical files. In this regard, the checksum values for each of the files are compared to each other to find all files that are identical. The comparison may be conducted using a variety of methods including a simple comparison. Alternatively, to limit the comparisons conducted, the checksums/files may be sorted prior to conducting a comparison (e.g., using any known type of sorting methodology). Step 304 may also include the calculation of the potential reduction in size when identical files are removed.

At step 306, a virtual disk image and/or streaming package may be created based on the new calculated size. It may be noted that in the case of a streaming package (used for downloading), the creation of the streaming package 306 may be performed prior to step 314.

At step 308, the application deployment is re-written (e.g., using the inventory tool) to the new virtual disk image/streaming package, replacing identical files with hard-links. In other words, multiple copies of a file are removed and in the file's place, a file link record (e.g., hard-link for hard media or a file-link for the streaming package) is written. Alternatively, a symbolic link may also be used in the file's place. Such a symbolic link, as used herein, is any construct that represents the location of the file.

With respect to a virtual disk image, when a file is written on disk, the data itself (i.e., the binary component) is written on sectors of the disk and there are records of what those files are. A useful analogy is that of a book—the chapter and text are similar to the data in the file and the table of contents (identifying where a chapter starts) is similar to the record of where the files are located. Instead of writing the same file twice, after the file is written once to the disk, all subsequent instances of the files are replaced with a hard link pointing to the location of the first instance on the disk. Thus, any additional references (beyond the first instance) to the identical file merely point to the same location on disk. Returning to the book analogy, it is similar to having two chapters with different titles and the table of contents identifies the same page number for the location of the chapter.

Stated in other words, when a file is written to a volume of media (e.g., a USB drive or a disc such as a CD or DVD), the contents of the file are written to the media and then an entry is added to an MFT (Master File Table). The MFT tells the operating system about the file and where to find the file's contents. When a hard link is created, a new entry is added to the MFT, but it points to the contents of the linked file. After the hard-link is created, the file system sees two files, but only the space for one file is needed on the disk/hard media.

However, before re-writing the files (i.e., and as part of step 308), the inventory tool may check to ensure that the file system and/or streaming package supports the use of hard-links (e.g., both file and file-links).

With respect to a disk, the support for hard-links may be part of the file system (i.e., the manner in which the drive is formatted) itself. For example, a master file table (MFT) and the use of hard-links are part of NTFS. On the other hand, hard-links may be not supported in other file systems (e.g., the FAT32 [file allocation table—32 bits] file system). Thus, the inventory tool may confirm that the drive is formatted in a manner that supports hard-links prior to re-writing the files.

A similar use of links and a confirmation of compatibility may also be utilized with respect to streamed applications. With a streaming package, embodiments of the invention may first check (or may require) that the streaming package format supports both file and file-links. For example, the TAR (tape archive) format is a package that supports both file and file links. Alternatively, the package may be compressed using LZMA compression (Lempel-Ziv-Markov chain algorithm), LZ-77 (LZ published in 1977), Deflate™, or any other lossless streaming compression. Such compression methodologies may also support the use of file-links.

At step 310, which is an optional optimization step, the inventory tool may be run again, on the virtual disk image/streaming package/replicated disk and compared with the output from the first run of the inventory tool (i.e., that was run on the master/original application deployment) to verify that the files are identical. Such a process may be performed either before or after step 314. The comparison may simply be conducted by confirming that the checksum values of the files in the re-written package/image are the same as the checksums for the files in the master.

Such a confirmation can be used to overcome various deficiencies of the prior art. More specifically, in the prior art, a replicated sample was sent back to the application developer/supplier for verification. In other words, an application supplier would develop an application/suite, build a master, compress the master, and provide the master to a vendor/service. Upon receipt, the vendor would unpack/uncompress the master, replicate the master onto a media (e.g., USB drive or DVD) and mail the completed replicated media back to the application developer/supplier. The application developer/supplier would then compare the received replicated media to the original master for verification. If an error was discovered (e.g., the integrity of the files was compromised), the application developer/supplier would have to notify the vendor who would then have to start the process over again. Such a repeated shipping of actual disks and confirmation of files on the disk between the vendor and application developer/supplier is time consuming and expensive.

Embodiments of the present invention overcome such problems. In this regard, the contents/data for the application, the inventory tool, and the checksum file (i.e., the output of the inventory tool that includes the checksum values for the files in the master) may all be part of the package sent to the vendor (by the application developer/supplier). The vendor can then use the inventory tool on the replicated media (and on the master if the master checksum file is not received) to produce checksum values. The vendor can then compare the two checksum files (i.e., the checksum file for the replicated media and the checksum file for the master), and confirm that the files in both the replicated media and master are identical (prior to or without ever shipping the replicated media back to the application developer/supplier). It may be noted that the checksum values do not change based on the use of the hard-links instead of the actual files. This lack of change results because the checksum value is calculated based on the file pointed to by the hard-link and not on the hard-link itself nor on the sector of the disk the files is located on.

At optional step 312, additional compression (i.e., lossless compression) may be performed on the data in the virtual disk image/streaming package.

At step 314, the application is deployed based on the virtual disk image/streaming package.

If the application is to be deployed on hard media, step 314 may include using the virtual disk image as the input to the media replication process. It may be noted that rather than performing the confirmation step 310 on the virtual disk image, step 310 may be performed on the replicated media created at step 314.

Alternatively, if the application is to be deployed across a network, step 314 may include uploading the package to a streaming service or downloadable location (e.g., a location accessible to authorized clients). In this regard, embodiments of the invention may be utilized with hosted, downloaded, and streamed applications. Instead of optimizing media size, the bytes transmitted over the network are optimized. Unlike with the media deployment, the destination file system may not support hard-links. As a result, a software tool may be needed on the client to restore redundant files as the application or application suite is transferred across a network. Accordingly, a client tool may be deployed (e.g., transmitted) to a client. Such a client tool is configured to download, uncompress, and read the streaming package. Further, the client tool must be configured to read both files and the link data from the streaming package. If the destination file system does not support linked files, the client tool may need to make a full copy of the linked files. Further, the deployment of the client tool may include pointing the client tool to the uploaded package. Further, various different actions run by the client tool may be multithreaded. Such different actions may include: downloading, running lossless decompression, unpacking the package (including resolving linked filed), and writing to disk.

It may also be noted that when transferring data on a data stream, the data stream can be visualized like a train. After the first train car (packet of data) is downloaded, it can be decompressed while the next train car (packet of data) is downloaded. After the first train car is decompressed, it can be unpacked. Similarly, while the second train car is decompressed, the third train car is downloaded, etc. The end result is that the data is ready to be used milliseconds after the download is complete. Such a process is distinguishable from other processed that after download require additional decompression.

In addition to the above, in many cases, a client system may already have files that are part of a current deployment. Embodiments of the invention may be configured to only move files across the network that do not currently exist on a user's system and reference the files that are already on the system as part of the deployment.

The installer is then executed by the client 102. From the client 102 perspective, when the installer (e.g., the client tool) runs, the installer does not know that there is only one file. The installer requests to read file a particular file (e.g., file ABC) from the operating system and simply reads it. When a hard-link (e.g., for file XYZ) is accessed by the installer, the installer simply requests to read the file identified by the hard-link without any knowledge that the contents of the two files (e.g., file ABC and file XYZ) are identical. Accordingly, there is no need to change the actual installer that a client utilizes. The installer merely accesses the contents of the file and does not realize that the hard-link identifies the same file location as that of another file already utilized. In this regard, since the hard-link is part of the file system, if an installer or other application accesses a file containing both a file and a hard-link to the file, the installer sees two separate files even though the amount of space on disk used is the amount of space for a single file.

In addition, when an installer executes, the application is installed in two locations—(1) in an archive (e.g., an archive folder); and (2) an application folder (e.g., where the application is actually installed). The archive may merely be a copy of the master. In addition, the copy stored in the archive may store hard-links rather than multiple copies of the same file. On the other hand, the application folder should not use hard-links—without careful inspection, the application may not know a file is a linked file instead of two copies of a file and, as described above, if one application were to delete or modify a file, another application relying on that file may fail. Accordingly, when installed, the installer may install multiple copies of the file into the application folder(s) for the various applications.

Confirmation of Compressed Application Deployment

The methodology described above may be used to compress and reduce the size of an application deployment. Further, if used on hard media (e.g., CD/DVD/USB), once the hard-links replace the actual files, it appears as if the entire file is stored on the media rather than just the hard-links. In other words, if a file examination utility (e.g., the File Manager™ application) is used to look at the hard media (i.e., CD/DVD/USB/etc.), the examination will indicate more bytes are stored on the drive than are actually consumed by the files. For example, the examination may indicate that more bytes (e.g., 20 GB) are stored on the hard media then are available on the hard media (e.g., a 16 GB USB drive). With additional investigation, one may easily discover the use of hard-links on such an NTFS file system. However, the initial examination may falsely indicate that each instance of a file represented by a hard-link is stored in full on the hard media (when in reality, only a hard-link is stored thereon).

CONCLUSION

This concludes the description of the preferred embodiment of the invention. The following describes some alternative embodiments for accomplishing the present invention. For example, any type of computer, such as a mainframe, minicomputer, or personal computer, or computer configuration, such as a timesharing mainframe, local area network, or standalone personal computer, could be used with the present invention. In summary, embodiments of the invention provide the ability to reduce the size of an application deployment by automatically searching for and replacing duplicate instances of files with hard-links in the deployment. In addition, traditional compression can be used to further reduce the size of the deployment. During installation, the installer (including legacy installers) follows the hard-links to install the duplicate instance(s) of the file(s) thereby avoiding any conflicts that may be caused by a deletion of a single instance of the file. Accordingly, one hundred percent (100%) of the duplicative identical files for a multi-application delivery on a fixed media or streaming package can be removed. In other words, all duplicative identical files across n-application in a deployment are removed. Such capabilities enable compression across bundles of software that include third party deployments.

The foregoing description of the preferred embodiment of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. A computer-implemented method for compressing an application deployment, comprising:

obtaining a master application to be deployed, wherein the master application comprises two or more files;

inventorying the two or more files in the master application;

identifying a first file instance and a second file instance from the two or more files, wherein the first file instance and the second file instance are identical; and writing an application deployment based on the master application, wherein the application deployment comprises the first file instance and a link to the first file instance instead of the second file instance.

2. The computer-implemented method of claim 1, wherein:

the inventorying comprises computing checksums for each of the two or more files in the master application; and the identifying comprises comparing the checksums.

3. The computer-implemented method of claim 2, further comprising:

computing checksums for files in the application deployment; and verifying the files in the application deployment are identical to the two or more files in the master application.

4. The computer-implemented method of claim 1, wherein the writing comprises:
   creating a virtual disk image; and
   writing the application deployment to the virtual disk image, wherein the link comprises a hard-link.

5. The computer-implemented method of claim 4, wherein:
   the inventorying comprises calculating a potential reduction in size that would result by removing identical files; and
   the virtual disk image is created based on the reduction in size.

6. The computer-implemented method of claim 4, the method further comprising:
   utilizing the virtual disk image as input to a media replication process.

7. The computer-implemented method of claim 1, wherein:
   the writing comprises writing the application deployment into a streaming package; and
   the method further comprises:
      uploading the streaming package;
      deploying a client tool to a client, wherein the client tool is configured to download and read the streaming package; and
      pointing the client tool to the uploaded streaming package.

8. The computer-implemented method of claim 1, wherein the writing further comprises compressing the application deployment.

9. An apparatus for compressing an application deployment in a computer system comprising:
   (a) a computer having a memory;
   (b) an application executing on the computer, wherein the application is configured to:
      (i) obtain a master application to be deployed, wherein the master application comprises two or more files;
      (ii) inventory the two or more files in the master application;
      (iii) identify a first file instance and a second file instance from the two or more files, wherein the first file instance and the second file instance are identical; and
      (iv) write an application deployment based on the master application, wherein the application deployment comprises the first file instance and a link to the first file instance instead of the second file instance.

10. The apparatus of claim 9, wherein the application is configured to:
    inventory the two or more files by computing checksums for each of the two or more files in the master application; and
    identify the first file instance and the second file instance by comparing the checksums.

11. The apparatus of claim 10, wherein the application is further configured to:
    compute checksums for files in the application deployment; and
    verify the files in the application deployment are identical to the two or more files in the master application.

12. The apparatus of claim 9, wherein the application is configured to write the application deployment by:
    creating a virtual disk image; and
    writing the application deployment to the virtual disk image, wherein the link comprises a hard-link.

13. The apparatus of claim 12, wherein:
    the application is configured to inventory by calculating a potential reduction in size that would result by removing identical files; and
    the virtual disk image is created based on the reduction in size.

14. The apparatus of claim 12, wherein the application is further configured to:
    utilize the virtual disk image as input to a media replication process.

15. The apparatus of claim 9, wherein:
    the application is configured to write by writing the application deployment into a streaming package; and
    the application is further configured to:
       upload the streaming package;
       deploy a client tool to a client, wherein the client tool is configured to download and read the streaming package; and
       point the client tool to the uploaded streaming package.

16. The apparatus of claim 9, wherein the application is configured to write by compressing the application deployment.

17. A computer readable storage medium encoded with computer program instructions which when accessed by a computer cause the computer to load the program instructions to a memory therein creating a special purpose data structure causing the computer to operate as a specially programmed computer, executing a method of compressing an application deployment, comprising:
    (a) obtaining, in the specially programmed computer, a master application to be deployed, wherein the master application comprises two or more files;
    (b) inventorying, in the specially programmed computer, the two or more files in the master application;
    (c) identifying, in the specially programmed computer, a first file instance and a second file instance from the two or more files, wherein the first file instance and the second file instance are identical; and
    (d) writing, in the specially programmed computer, an application deployment based on the master application, wherein the application deployment comprises the first file instance and a link to the first file instance instead of the second file instance.

18. The computer readable storage medium of claim 17, wherein:
    the inventorying comprises computing checksums for each of the two or more files in the master application; and
    the identifying comprises comparing the checksums.

19. The computer readable storage medium of claim 18, further comprising:
    computing, in the specially programmed computer, checksums for files in the application deployment; and
    verifying, in the specially programmed computer, the files in the application deployment are identical to the two or more files in the master application.

20. The computer readable storage medium of claim 17, wherein the writing comprises:
    creating, in the specially programmed computer, a virtual disk image; and
    writing, in the specially programmed computer, the application deployment to the virtual disk image, wherein the link comprises a hard-link.

21. The computer readable storage medium of claim 20, wherein:
    the inventorying comprises calculating a potential reduction in size that would result by removing identical files; and
    the virtual disk image is created based on the reduction in size.

22. The computer readable storage medium of claim 20, the method further comprising:

utilizing, in the specially programmed computer, the virtual disk image as input to a media replication process.

23. The computer readable storage medium of claim 17, wherein:
the writing comprises writing the application deployment into a streaming package; and
the method further comprises:
uploading the streaming package;
deploying a client tool to a client, wherein the client tool is configured to download and read the streaming package; and
pointing the client tool to the uploaded streaming package.

24. The computer readable storage medium of claim 17, wherein the writing further comprises compressing the application deployment.

* * * * *